(12) United States Patent
Ma et al.

(10) Patent No.: US 7,445,464 B2
(45) Date of Patent: Nov. 4, 2008

(54) IC SOCKET WITH CONTACTS

(75) Inventors: Hao-Yun Ma, Tu-Cheng (TW);
Yu-Chen Chen, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/810,271

(22) Filed: Jun. 5, 2007

(65) Prior Publication Data
US 2007/0281527 A1    Dec. 6, 2007

(30) Foreign Application Priority Data
Jun. 5, 2006    (TW) .............................. 95209739 U

(51) Int. Cl.
*H01R 12/00*    (2006.01)

(52) U.S. Cl. ........................................... 439/71; 439/66

(58) Field of Classification Search .................. 439/66, 439/70–71
See application file for complete search history.

(56) References Cited

U.S. PATENT DOCUMENTS 6,533,597 B1 *    3/2003    Wang et al. .................. 439/342

* cited by examiner

*Primary Examiner*—Truc T Nguyen
(74) *Attorney, Agent, or Firm*—Wei Te Chung

(57) ABSTRACT

An IC socket includes a plurality of terminals (7) arranged in a matrix defined by row and column directions perpendicular to each other. The terminal includes a contact arm (73) extending from a middle portion of the terminal. The contact arm includes a first resilient arm (731) extending essentially towards the row direction in a first direction, from a top view, and a second resilient arm (733) angled with the first resilient arm and extending essentially towards the row direction in a second direction, from the top view, different from the first direction. Since the second resilient arm extends essentially toward the row direction, rather than parallel to the row direction, and a larger recess is formed between respective resilient arms of adjacent terminals in a same row, there will not be apt to form a short circuit between any portions of the first lower resilient arm and the second upper resilient arm.

3 Claims, 4 Drawing Sheets

IC SOCKET WITH CONTACTS

BACKGROUND OF THE INVENTION

1. Field of the Invention

The present invention relates to the art of electrical connectors, and more particularly to an IC socket having contacts for avoiding short circuit between two adjacent contacts in a row.

2. Description of the Related Art

An IC socket (not shown), as known in the prior art, generally includes an insulative housing with a plurality of passageways (not shown) extending therethrough, and a plurality of contacts disposed in the respective passageways and generally arranged in a matrix defined by row and column direction perpendicular to each other. One conventional IC contact 7' for use in the IC socket is shown, in FIGS. 3 and 4, to include a base section 74' for being retained in a passageway of the IC socket, a terminal section 75' provided at a lower side of the base section 74' and adapted for a solder material (not shown) to be fused thereon for electrically connecting a circuit board (not shown), a contact section 731' provided at an upper side of the base section 74' and adapted for electrically contacting an IC package, and a spring arm 73' disposed between the base section 74' and the contact section 731' and extending from a lateral side of the base section 74'. The spring arm 73' further includes a first spring portion 731' extending in an offset manner with respect to the base section 74', and a second spring portion 733' successively extending from the first spring portion 731' and disposed parallel to the row direction.

A problem, however, with the IC socket is that there is apt to form a short circuit between the second spring portion 733' of one contact 7' and a first spring portion 731' of an adjacent contact 7' in a same row. This is so because the second spring portion 733' is arranged parallel to the row direction, and a limited distance, designated as "L'", is formed. The short circuit formation of adjacent terminals will result in electrical connection failure to the IC package or the circuit board. Therefore, there is a need to provide a new IC socket to resolve the above-mentioned shortcomings.

SUMMARY OF THE INVENTION

An IC socket according to a preferred embodiment of the present invention includes an insulative housing defining a plurality of passageways, and a plurality of terminals disposed in the respective passageways and arranged in a matrix defined by row and column directions perpendicular to each other. Each of the terminals includes a base section retained within a corresponding passageway, a terminal section provided at a lower side of the base section and adapted for electrically connecting a circuit board, a spring or contact arm, and a contact section formed at a free end of the contact arm for electrically contacting an IC package. The contact arm further includes a first resilient arm, and a second resilient arm successively extending from the first resilient arm. The first resilient arm extends from an upper side of the base section and essentially towards the row direction in a first direction, from a top view, while the second resilient arm is angled with the first resilient arm in a second direction, from the top view, different from the first direction, the second direction being essentially towards the row direction, rather than parallel to the row direction. As compared with the prior art, since the second resilient arm is configured to extend essentially toward the row direction, rather than parallel to the row direction, and a larger recess is formed proximate to a lower portion of a lower portion of a resilient arm of an adjacent terminal in a same row, there will not be apt to form a short circuit between any portions of the first lower resilient arm and the second upper resilient arm.

Other features and advantages of the present invention will become more apparent to those skilled in the art upon examination of the following drawings and detailed description of preferred embodiments, in which:

DETAILED DESCRIPTION OF PREFERRED EMBODIMENT

Figure 1:
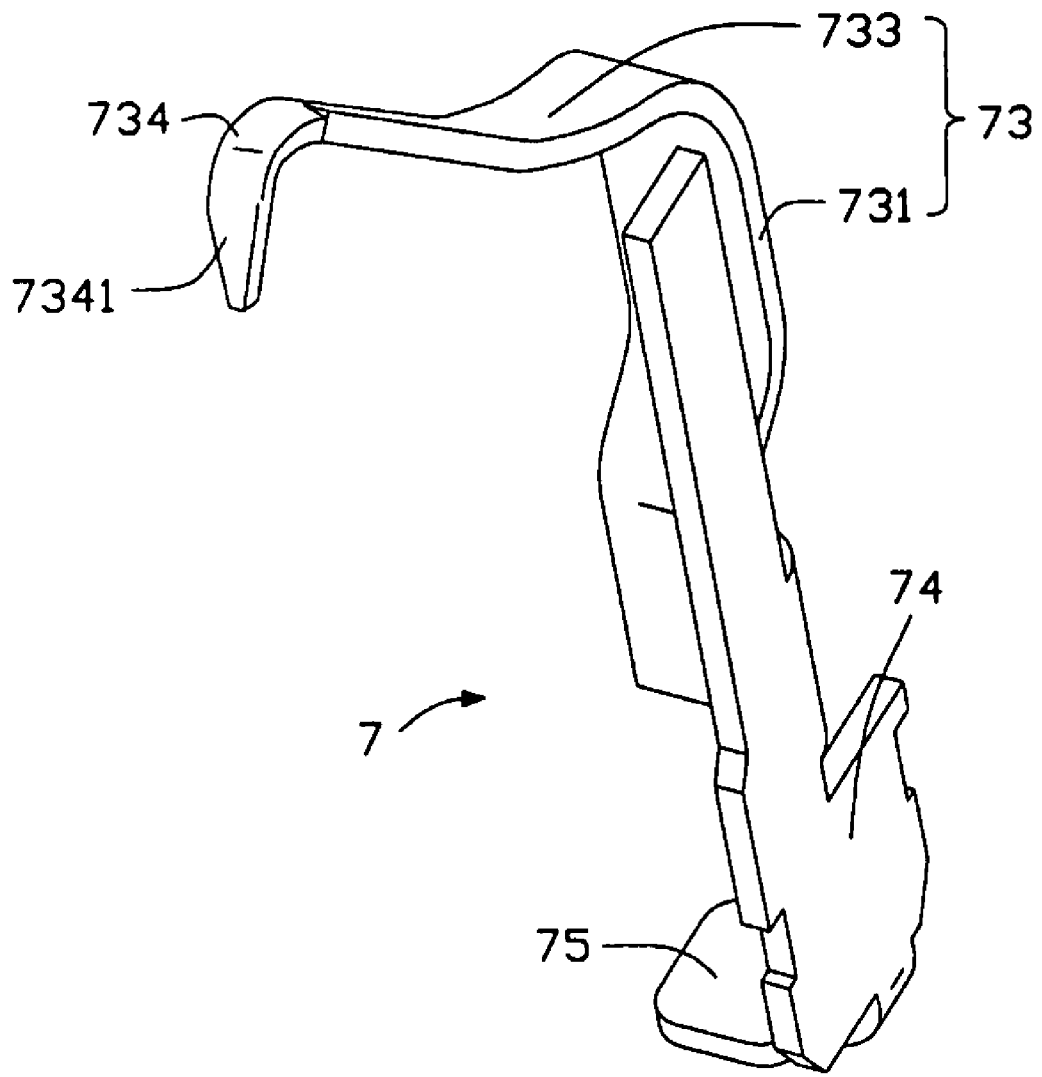
FIG. 1 is a perspective view of an IC contact according to a preferred embodiment of the present invention.
Figure 2:
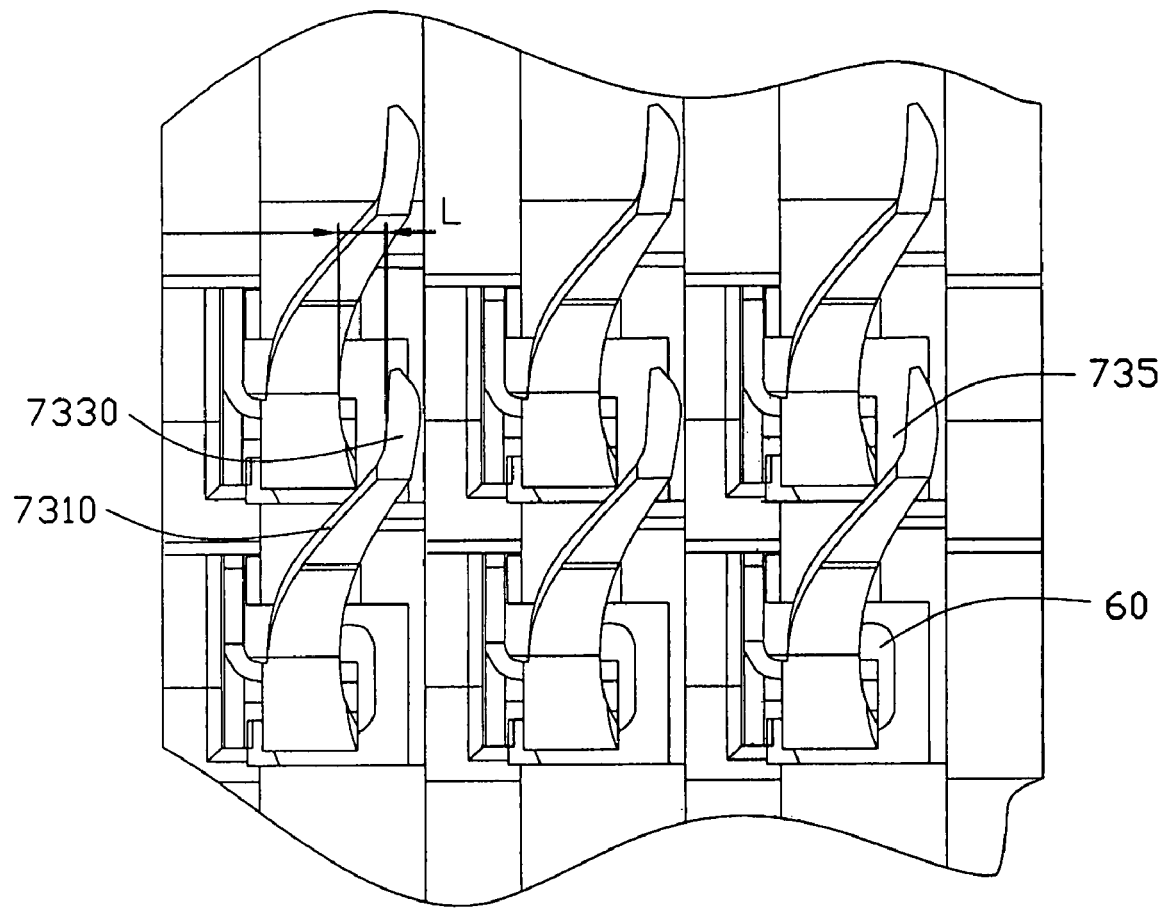
FIG. 2 is a top view of an array of IC contacts, for use in an IC socket, of FIG. 1.
Figure 3:
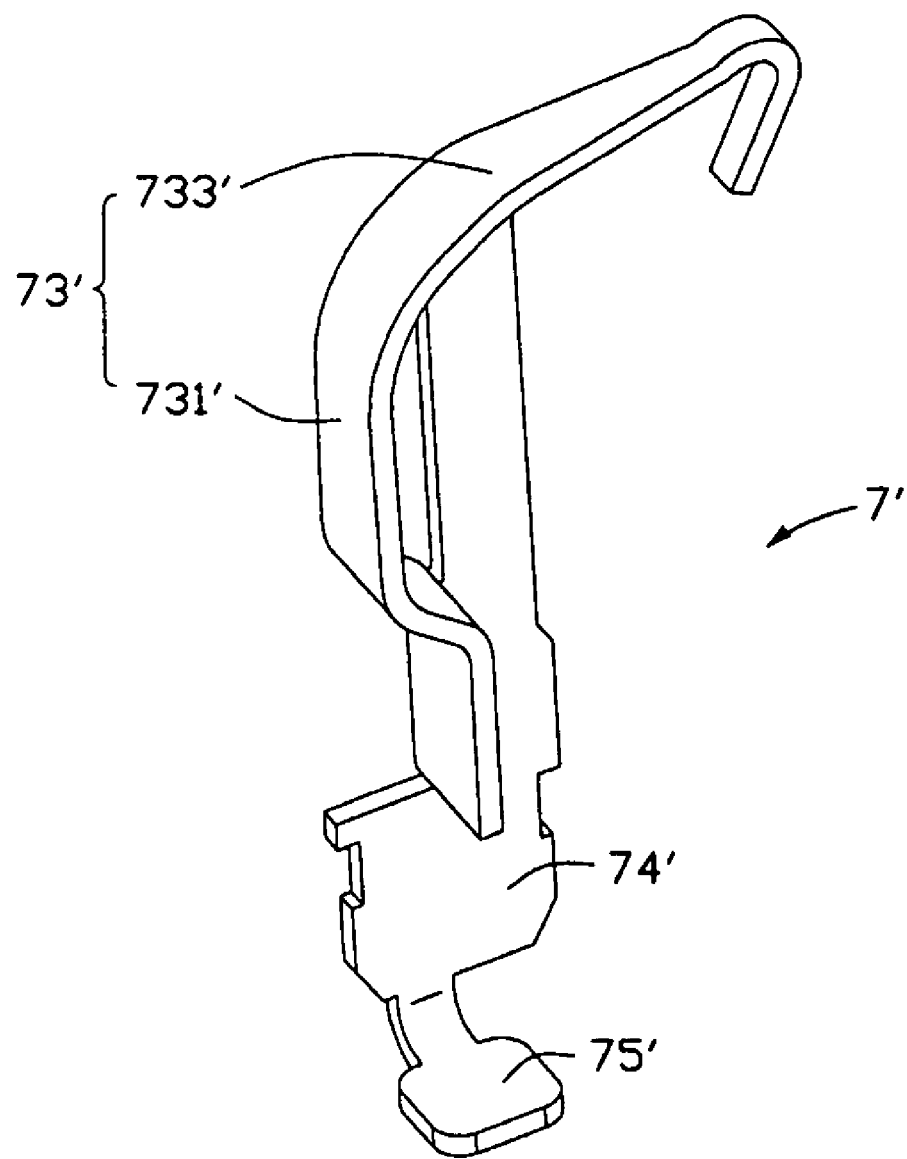
FIG. 3 is a perspective view of a conventional IC contact.
Figure 4:
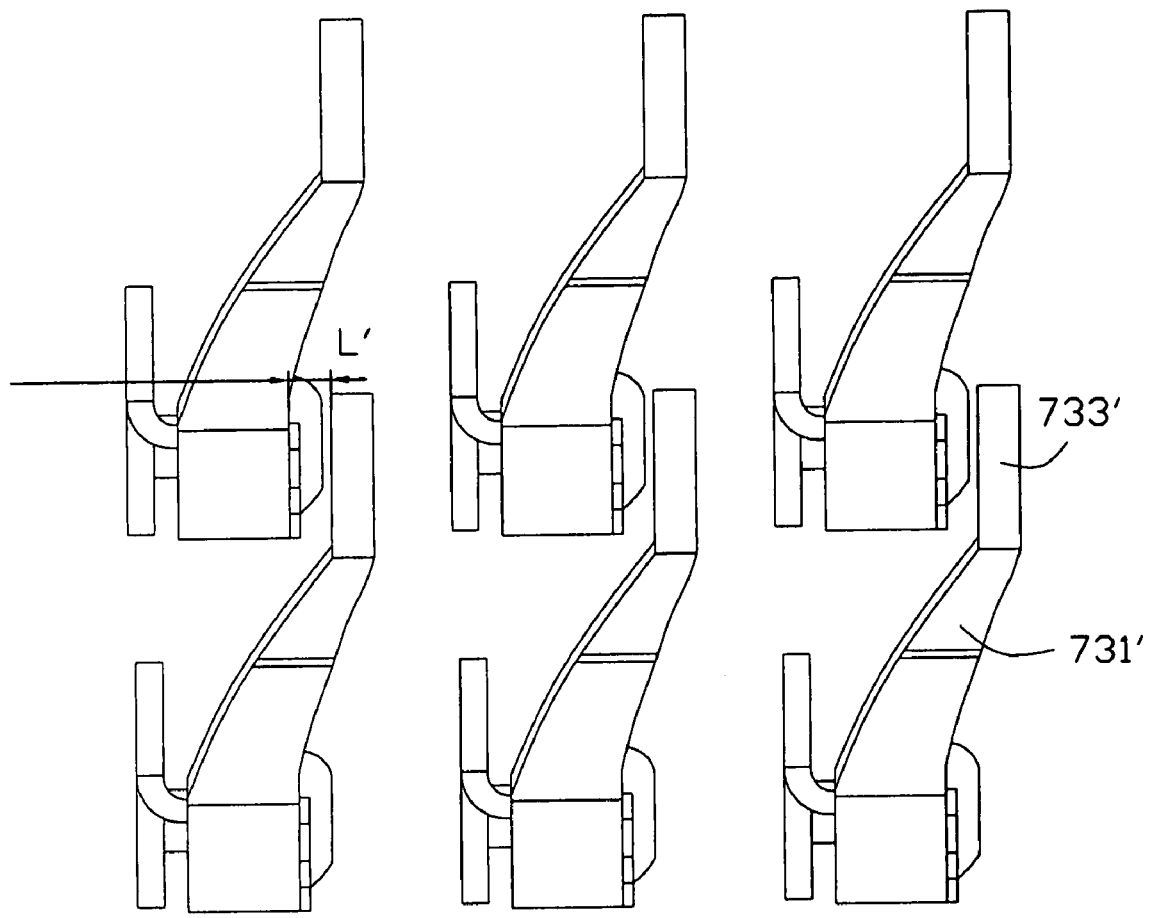
FIG. 4 is a top view of an array of IC contacts of FIG. 3.

Referring to FIGS. 1 and 2, an IC socket according to a preferred embodiment of the present invention includes an insulative housing having a plurality of passageways 60 extending therethrough, a plurality of terminals 7 disposed in the respective passageways 60 and arranged in matrix defined by row and column directions perpendicular to each other. Each of the terminals 7 comprises a middle base section 74 retained in a corresponding passageway 60, a terminal section 75 provided at a lower side of the middle base section 74 and adapted for electrically connecting a circuit board (not shown), a spring or contact arm 73, and a contact section 734 formed at a free end of the spring arm 73 and adapted for electrically contacting an IC package (not shown). The base section 74 is of a plate-like configuration. The terminal section 75 is configured for a solder material, such as a solder ball (not shown), to be fused thereon. In this embodiment, the terminal section 75 is arranged substantially perpendicular to the middle base section 74. The contact section 734 further includes a distal end 7341 in width being gradually decreased for some factors including manufacturing consideration.

The spring arm 73 further includes a first lower resilient arm 731 extending from a lateral side of the middle base section 74 and located at an upper side of the base section 74, and a second upper resilient arm 733 successively extending from the first lower resilient arm 731. The first lower resilient arm 731 is configured to extend essentially towards the row direction in a first direction, from a top view, while the second resilient arm 733 is angled with the first resilient arm 731 in a second direction, from the top view, different from the first direction, wherein the second direction is also essentially towards the row direction, rather than parallel to the row direction as known in the prior art. As seen in FIG. 2, from the top view, a larger recess 735 is thereby formed between a first side edge 7310 defined by the first lower resilient arm 731, and a second side edge 7330 defined by the second upper resilient arm 733. It should be noted that the side edges 7310 and 7330 of the first resilient arm 731 and the second resilient arm 733 might be linear or non-linear depending on various applications, as long as the first side edge 7310 extends essentially towards the row direction in a first direction, and the second side edge 7330 extends essentially towards the row direction, rather than parallel to the row direction, in a second direction different from the first direction. Since the recess 735 is provided proximate to a lower portion of a resilient arm 73 of an adjacent terminal 7 in a same row, and a larger distance, designated as "L", is thereby obtained by defining such a recess 735, there will not be apt to form a short circuit between any portions of the first lower resilient arm 731 and the second upper resilient arm 733.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. An IC socket comprising:
   an insulative housing defining a plurality of passageways in rows and columns which define row and column directions perpendicular to each other;
   a plurality of contacts disposed in the corresponding passageways, respectively;
   each of said contacts including:
   a lower resilient arm essentially close to a corresponding inner wall in the corresponding passageway; and
   an upper curved resilient arm extending upwardly from an upper end of the lower vertical resilient arm; wherein
   in a side view, said upper curved resilient arm is configured with a bottom section having a lower slope and an upper section having a higher slope;
   from a top view, said bottom section includes a reverse point along an edge, where an edge extension of said edge experiences a direction shift sideward, wherein said edge experiences both leftward and rightward extensions relative to said row direction along which the contact generally extends in said top view.

2. The IC socket of claim 1, wherein the upper section is at a higher level than that of the bottom section.

3. The IC socket of claim 2, wherein said upper curved resilient arm of the contacts in a row are located at one side of a central line of the row.

* * * * *